(12) United States Patent
Prymak et al.

(10) Patent No.: US 8,410,536 B2
(45) Date of Patent: Apr. 2, 2013

(54) SUBSTRATE WITH EMBEDDED PATTERNED CAPACITANCE

(75) Inventors: John D. Prymak, Greer, SC (US); Chris Stolarski, Greenville, SC (US); Alethia Melody, Simpsonville, SC (US); Antony P. Chacko, Greer, SC (US); Gregory J. Dunn, Arlington Heights, IL (US)

(73) Assignee: Kemet Electronics Corporation, Simpsonville, SC (US)

( * ) Notice: Subject to any disclaimer, the term of this patent is extended or adjusted under 35 U.S.C. 154(b) by 0 days.

(21) Appl. No.: 13/345,227

(22) Filed: Jan. 6, 2012

(65) Prior Publication Data
US 2012/0106032 A1    May 3, 2012

Related U.S. Application Data

(62) Division of application No. 12/180,768, filed on Jul. 28, 2008.

(51) Int. Cl.
*H01L 27/108* (2006.01)
*H01G 4/005* (2006.01)

(52) U.S. Cl. ........ 257/310; 257/296; 257/669; 257/676; 257/773; 257/E23.062; 257/E23.079; 257/E27.024; 361/303; 361/306.1; 361/528; 361/540; 361/763; 438/244; 438/381; 438/761

(58) Field of Classification Search .................. 257/296, 257/310, 669, 676, 773, E23.062, E23.079, 257/E27.024; 361/303, 306.1, 528, 540, 361/763; 438/244, 381, 761
See application file for complete search history.

(56) References Cited

U.S. PATENT DOCUMENTS

| | | | |
|---|---|---|---|
| 6,246,569 B1 | 6/2001 | Strange | |
| 6,462,935 B1 | 10/2002 | Shiue | |
| 6,571,126 B1 | 5/2003 | O'Phelan et al. | |
| 6,628,505 B1 | 9/2003 | Andelman | |
| 6,657,849 B1 | 12/2003 | Andresakis et al. | |
| 6,865,071 B2 | 3/2005 | Katsir et al. | |
| 6,979,854 B2 * | 12/2005 | Yamasaki et al. | 257/310 |
| 7,072,168 B2 * | 7/2006 | Horikawa et al. | 361/303 |
| 7,126,811 B2 | 10/2006 | Hirano et al. | |
| 7,138,068 B2 | 11/2006 | Dunn et al. | |

(Continued)

FOREIGN PATENT DOCUMENTS
GB    1481904    8/1977

OTHER PUBLICATIONS

International Preliminary Report on Patentability and Written Opinion of the International Searching Authority, Beate Giffon-Schmitt, PCT/US2009/051919, Feb. 1, 2011.

(Continued)

*Primary Examiner* — Dao H Nguyen
(74) *Attorney, Agent, or Firm* — Joseph T. Guy; Perkins Law LLC

(57) ABSTRACT

A process for forming a laminate with capacitance and the laminate formed thereby. The process includes the steps of providing a substrate and laminating a conductive foil on the substrate wherein the foil has a dielectric. A conductive layer is formed on the dielectric. The conductive foil is treated to electrically isolate a region of conductive foil containing the conductive layer from additional conductive foil. A cathodic conductive couple is made between the conductive layer and a cathode trace and an anodic conductive couple is made between the conductive foil and an anode trace.

12 Claims, 5 Drawing Sheets

U.S. PATENT DOCUMENTS

| | | | |
|---|---|---|---|
| 7,193,838 B2* | 3/2007 | Dunn et al. | 361/301.1 |
| 7,317,610 B2* | 1/2008 | Nakamura et al. | 361/540 |
| 7,485,411 B2 | 2/2009 | Jung et al. | |
| 7,940,516 B2* | 5/2011 | Shioga et al. | 361/523 |
| 2001/0026444 A1 | 10/2001 | Matsushima | |
| 2003/0182781 A1 | 10/2003 | Miki et al. | |
| 2006/0002097 A1* | 1/2006 | Borland et al. | 361/763 |
| 2006/0207970 A1 | 9/2006 | Dunn et al. | |
| 2007/0159771 A1* | 7/2007 | Saito et al. | 361/528 |
| 2008/0216296 A1* | 9/2008 | Prymak et al. | 29/25.03 |

OTHER PUBLICATIONS

Extended European Search Report, EP09803461.4-1232, Nov. 24, 2011, Pacholec.

European Patent Application No. 09 803 461.4; Office Action, dated Nov. 6, 2012.

* cited by examiner

SUBSTRATE WITH EMBEDDED PATTERNED CAPACITANCE

CROSS-REFERENCE TO RELATED APPLICATIONS

The present application is a divisional application of pending U.S. Pat. No. 12/180,768 filed Jul. 28, 2008 which are incorporated herein by reference.

BACKGROUND

The present invention is related to an improved method for forming a capacitor. More specifically, the present invention is related to a method for forming a circuit board having capacitors formed therein.

Capacitors are utilized in virtually every electronic device. Their function in an electronic circuit is well known and further discussion is not warranted herein.

It is an ongoing desire in the electronics industry to miniaturize circuitry. This miniaturization is intended to occur without loss of capability.

There are two major approaches to miniaturization. One approach is to miniaturize each and every component of a circuit and/or to increase the density of components in a circuit. This approach has been widely exploited and great strides have been made. Unfortunately, as the component size decreases, the handling complexity increases, requiring ever more intricate pick & place equipment which often must be developed, increasing production cycle time and overall manufacturing cost. Furthermore, as parts become smaller and more densely placed, parasitics within and between components increase.

A second approach to miniaturization is to combine functionality in selected components. For example, the real estate represented by the circuit board substrate functions, by and large, as structural support and for connectivity only and it does not otherwise contribute to the electrical function of the electrical circuit. Incorporating functionality into the area occupied by the substrate would serve two functions. A component which would otherwise be surface mounted, or otherwise incorporated, could be eliminated and the substrate space which is otherwise functionless can be reclaimed. While this is straightforward in theory, actually incorporating the functionality within the substrate has been difficult to implement in many applications. Gains have been made toward incorporating individual capacitors into a circuit substrate, as presented in U.S. Pat. No. 7,126,811; however, placement of discrete devices thin enough to be incorporated in a circuit substrate requires delicate pick and place equipment in order to avoid mechanical stresses to the part which may result in electrical defects, increased rework, etc. Placement of individual devices also requires extra processing time when compared to the lamination of a single layer.

There are applications where large decoupling capacitors are required for integrated circuit performance yet there is insufficient space available on the integrated circuit to allow the inclusion of such large capacitors. In such instances, external capacitance is recommended to be added as the integrated circuit is assembled to a circuit board, but an embedded capacitance layer could be sufficiently sized to be buried within the circuit board substrate, thus eliminating the need for an external capacitance.

Incorporation in the substrate of a ceramic or polymer-based embedded capacitance layer such as that presented in U.S. Pat. No. 6,657,849, is known in the art. These layers may be formed in advance and then incorporated with other layers using lamination processes well-known in the industry, requiring less processing time and less complex assembly equipment than incorporation of discrete components. However, the attainable capacitance is limited to a few hundred picofarads per square centimeter. A different type of capacitor, such as that created from a valve metal substrate, is necessary to maximize the available capacitance in the incorporated layer and the board space savings due to incorporation of the capacitance layer.

Manufacture of a valve metal based capacitance layer for incorporation into a circuit board substrate has been described in U.S. Pat. No. 7,317,610. Here, cathode layers are formed on the surface of a dielectric anodic oxide of a sheet-like valve metal substrate. The resulting sheet-shaped capacitor forms an embedded capacitance layer having high capacitance per area (on the order of tens of microfarads per square centimeter) for incorporation into a printed circuit substrate. However, there is not presented a means for electrical isolation of the anode and cathode layers during the circuit substrate assembly process. Specifically, during the formation of plated through holes, there is no mechanism in place to prevent contact between the valve metal substrate and the solid electrolyte material, leaving a possible means for the generation of an electrical short. Katsir, et. al. present in U.S. Pat. No. 6,865,071 a method by which the valve metal and dielectric are selectively applied in the vapor phase. This allows for the formation of discrete regions of the anode substrate which have no porous dielectric coating; however, application of the solid electrolyte and subsequent cathode layers must be controlled such that the conductive cathode coatings remain electrically isolated from the anode. Costly equipment is required to control application of the cathode materials such that electrical isolation of the electrodes is maintained without deleterious effect on capacitance per area.

The present invention is directed to a simple and cost-effective method for incorporating large capacitance into a substrate during manufacture.

SUMMARY

It is an object of the present invention to provide an improved method for the formation of capacitors.

It is another object of the present invention to provide an improved method for forming a circuit board comprising capacitance.

A particular feature of the present invention is a method of manufacturing a capacitor integrated into a substrate.

A particular advantage of the present invention is the ability to reclaim real estate within an electrical circuit which otherwise provides no contribution to the electronics of the circuit.

Another advantage of the present invention is the ability to eliminate a surface mounted component by incorporating the function thereof into the substrate or circuit board.

These and other advantages, as will be realized, are provided in a process for forming a laminate with capacitance. The process includes the steps of providing a substrate and laminating a conductive foil anode on the substrate, wherein the foil has a dielectric thereon. A capacitor is then formed by forming a cathode comprising one or more conductive layers on the dielectric. The conductive foil is treated to electrically isolate a region of conductive foil containing the cathode from additional conductive foil. Electrical connections are made between the capacitor cathode and a circuit trace and between the conductive foil anode and a second circuit trace.

Yet another embodiment is provided in a process for forming a laminate with capacitance. The process includes the steps of providing a substrate and laminating a conductive foil on the substrate, wherein the foil acts as a capacitor anode and has a dielectric thereon. An isolation dam is applied on the dielectric. A cathode comprising one or more conductive layers is formed on the dielectric, wherein the isolation dam circumvents, and preferably circumscribes the at least one conductive layer. The conductive foil is treated to electrically isolate a region of conductive foil containing the cathode from additional conductive foil. An electrical connection is established between the capacitor cathode and a circuit trace. Electrical connection to the capacitor anode is established by connecting a region of the conductive foil outside the isolation dam to a second circuit trace.

Yet another embodiment is provided in a layered substrate with capacitance. The layered structure has a first substrate and a conductive foil laminated to the first substrate wherein the conductive foil has a dielectric thereon. A cathode is on the dielectric. A second substrate forms a layered structure with the conductive foil and cathode between the first substrate and the second substrate. A first trace is on at least one of the first substrate and the second substrate and a first via forms an electrical connection between the cathode and the first trace. A second trace is on at least one of the first substrate and the second substrate and a second via forms an electrical connection between the conductive foil and the second trace.

DETAILED DESCRIPTION OF THE INVENTION

The invention will be described with reference to the various figures forming an integral non-limiting part of the disclosure. In the various figures, similar elements will be numbered accordingly.

Described is a process for forming a capacitor which is integral to a printed circuit board or substrate. More specifically, the invention describes a process for manufacturing a printed circuit board, or substrate, with capacitance integral thereto.

In a preferred embodiment, the substrate, with an integral capacitor, will be further processed by the incorporation of additional layers to form a completed substrate with a capacitor embedded therein.

Figure 1:
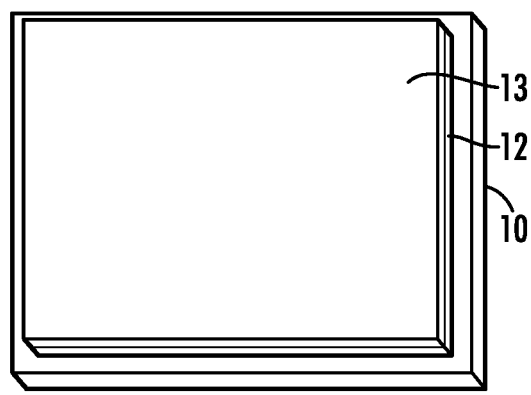
FIG. 1 is a schematic top view illustrating a foil laminated on a substrate.

The invention can be described by the process illustrated in the following figures. In FIG. 1, a conductive foil, 12, is attached, adhered, or laminated to an unfinished substrate, 10. The conductive foil comprises a dielectric layer, 13, formed on at least that surface which is away from the substrate. The dielectric layer can be formed after the foil is on the substrate but prior formation is preferred. The conductive foil is preferably a valve metal selected from aluminum, tantalum, niobium, titanium or a combination thereof or a conductive oxide such as NbO. The conductive foil will ultimately form the anode. In one embodiment, the dielectric is preferably formed by anodic oxidation of the foil. It is preferable to have only one dielectric layer; however, both sides of the foil can contain an oxide layer. Metal foil with a single oxide layer is not commercially available under favorable terms, thereby necessitating the use of a foil with both sides oxidized. It is preferred that the surface of the conductive foil is roughened to increase the surface area prior to anodizing to form the oxide dielectric.

The dielectric can be formed by other methods including vapor deposition, sol-gel applications, and solvent based applications, and may be an oxide of the conductive foil or a different material, such as a ceramic dielectric.

Figure 2:
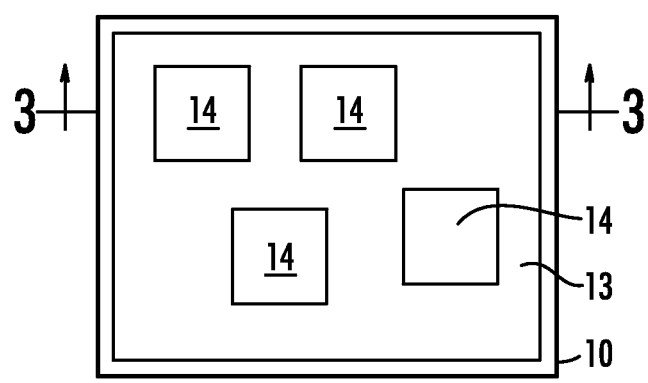
FIG. 2 is a schematic top view illustrating a conductive layer formed on the dielectric of a foil.
Figure 3:
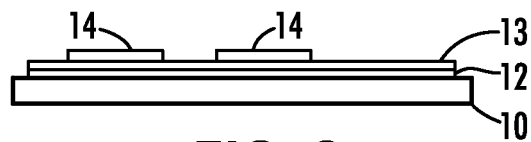
FIG. 3 is a schematic cross-sectional side view taken along line 3-3 of FIG. 2.

As illustrated schematically in top view in FIG. 2 and in side view in FIG. 3 taken along line 3-3 of FIG. 2, a solid electrolyte layer, 14, is formed on the exposed dielectric layer, 13, in regions where the capacitive functionality is desired. The solid electrolyte layer may consist of one or more layers of one or more conductive polymers. Preferred conductive polymers include polypyrrole, polyaniline, and polythiophene. For the purposes of the present invention, polypyrrole, polyaniline, and polythiophene refer equally to derivatives thereof. The conductive polymer may be applied from a solution or suspension or the conductive polymer may be formed in-situ by coating a monomer and oxidizer sequentially. In-situ polymer formation from monomer is less preferred due to the complexities of incorporating the process into conventional in-line automated processes since the number of process steps is necessarily increased with in-situ formation. Furthermore, in-situ polymer formation from monomer typically provides a thicker, less dense, polymer layer which is less desirable in most applications. The polymer layer is applied by any technique available in the art, without limit, with exemplary methods including ink jet printing, screen-printing, gravure coating, or masked spraying. The solid electrolyte layer may comprise a manganese dioxide layer either in addition to a polymer layer or instead of the polymer layer. The manganese dioxide layer is preferably formed by applying a solution of a manganese compound, such as manganese nitrate or a permanganate, followed by converting the manganese compound to manganese dioxide by heat. It is preferable that the manganese dioxide layer be deposited prior to deposition of the polymer; however, they can be added as a mixture.

Figure 4:
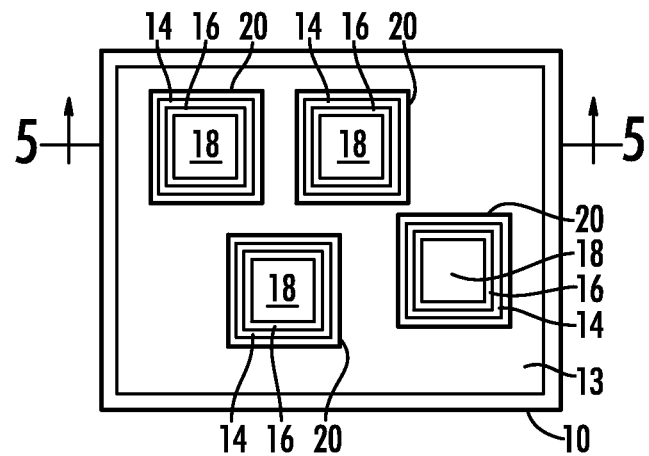
FIG. 4 is a schematic top view illustrating additional layers.
Figure 5:
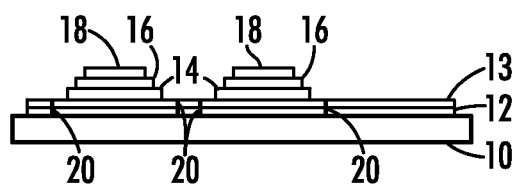
FIG. 5 is a schematic cross-sectional side view taken along line 5-5 of FIG. 4.

A carbon layer, 16, is preferably applied over the solid electrolyte layer, 14, as illustrated schematically in top view in FIG. 4 and in schematic cross-sectional view in FIG. 5 taken along line 5-5 of FIG. 4. The carbon layer improves adhesion between the solid electrolyte layer, 14, and subsequent conductive layer, 18, and is therefore preferred. The carbon layer is formed on the patterned surface of the solid electrolyte layer by applying a paste, or thick ink, containing carbon particles preferably in the form of graphite or carbon black. The carbon layer can be applied by ink jet printing, screen-printing, gravure printing or by spraying without limit thereto.

The conductive layer, 18, is a layer which allows formation of a highly conductive connection between the cathode and subsequent circuitry. The conductive layer may be silver, copper, gold, or another highly conductive metal or a combination thereof. Particularly preferred is a silver, copper or silver/copper ink or paste. The layer may be deposited by ink jet printing, screen printing, gravure printing, spraying, sputtering, atomic layer deposition or other means for applying a thin layer deposition. The cathode refers to either the solid electrolyte layer or the combination of the solid electrolyte layer, carbon layer and conductive layer.

Referring still to FIGS. 4 and 5, each capacitive couple is preferably isolated from the others by a demarcation, 20, in the foil, which electrically isolates that portion of the foil acting as the anode and forming a capacitor with the cathode layers from the remaining foil. The demarcation can be formed by etching or dicing at least through the oxide layer and the valve metal foil layer. It would be apparent that that the kerf width of the demarcation must be sufficiently wide to avoid current crossing the demarcation. While the demarcation is illustrated as a narrow strip, it is understood that it may include any or all of the foil which is not functioning as the anode of a capacitor with the understanding that a sufficient area of foil is removed to avoid current flow from the anode portion to surrounding functioning foil. A width of about 0.025 mm is sufficient. However, 0.05 mm is more preferable. In one embodiment, foil may remain in the finished substrate, wherein the remaining foil provides either no electrical function or functions as a component in an element other than a capacitor. In another embodiment, windows and holes may be created in the foil base before application of the foil to the semi-finished substrate, or these areas may be removed subsequent to the application. The holes or windows will allow vias and plated through holes to pass through this layer without connection to any of the capacitive elements and will facilitate registration of the foil during the lamination process.

In one embodiment, the conductive foil may remain intact between capacitors, thereby ultimately forming multiple capacitors with a common anode. Ground and power connections could then be established between at least two of the multiple cathodes without connecting to the conductive foil anode, comprising a capacitor device connected in a non-polar configuration. This could allow greater flexibility in the design of a circuit substrate in that an embedded capacitance layer with a given isolation dam and cathode application pattern could be utilized for more than one circuit substrate design. In one embodiment the isolation dam is a non-conductive region formed by treating the conductive material to render it non-conductive.

After demarcation, a functional capacitor, or multiple capacitors, is provided on a substrate and the substrate may be suitable for use in some applications. Alternatively, the demarcations may completely sever one or more functional capacitors mounted on a substrate from the larger substrate for use. In a particularly preferred embodiment further processing ensues to prepare a printed circuit board with capacitance incorporated therein.

Figure 6:
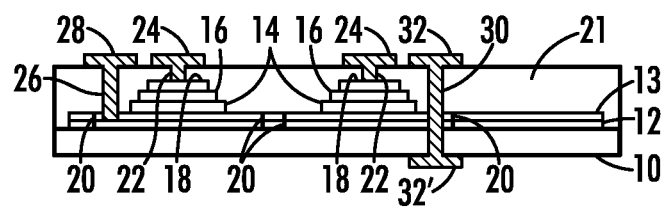
FIG. 6 is a schematic cross-sectional side view of an embodiment of the present invention.
Figure 7:
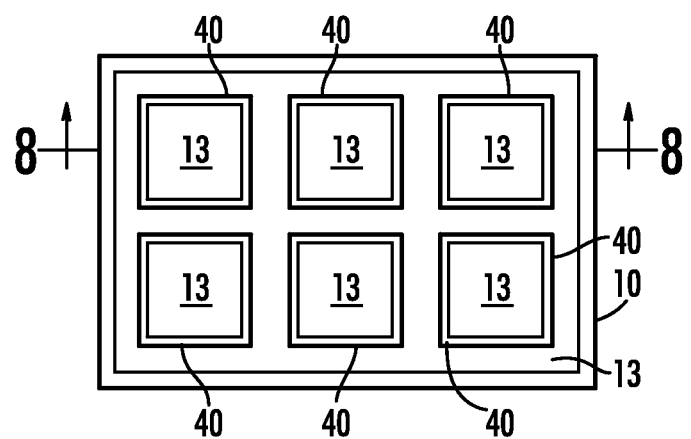
FIG. 7 is a schematic top view of a foil laminated to a substrate with isolation dams coated thereon.
Figure 8:
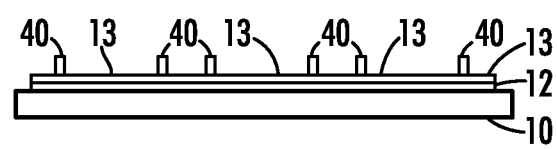
FIG. 8 is a schematic cross-sectional side view taken along line 8-8 of FIG. 7.
Figure 9:
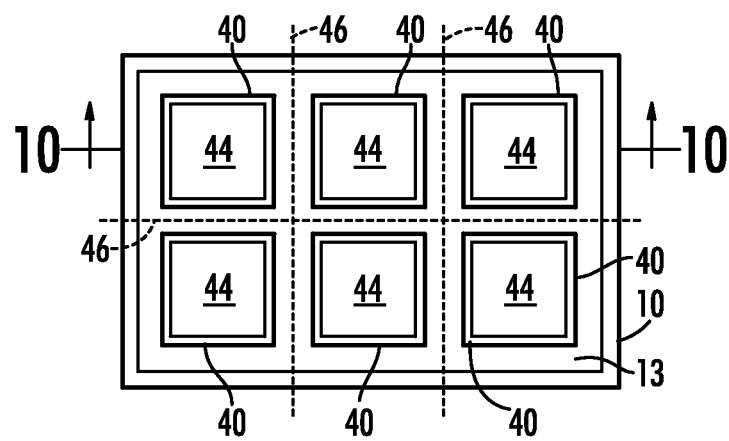
FIG. 9 is a schematic top view of an embodiment of the present invention.
Figure 10:
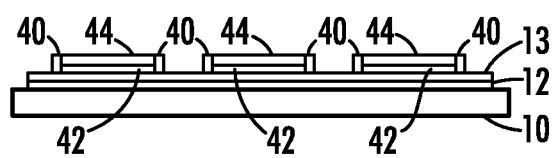
FIG. 10 is a schematic cross-sectional side view taken along line 10-10 of FIG. 9.

As illustrated in FIG. 6, it is preferable to apply, preferably by lamination, additional circuit board material, 21, over the capacitor and semi-finished substrate, thereby forming the embedded capacitance or an embedded capacitor within the substrate material. The additional circuit board layers are applied by any technique known in the art and standard materials are suitable for use therein. After lamination, and in the course of forming additional layers of the circuit board material, the anode and cathode terminals of the capacitor must be accessed for connection to eventual circuit traces on the circuit board. The connectivity among layers is preferably made with a blind via or a through hole, both of which will be described, while traces of conductive material (i.e. copper) afford connection to multiple areas at each layer. In FIG. 6, a cathodic blind via, 22, is formed directly above the cathode region of the capacitor. This allows a conductor to be brought into electrical contact with both the cathode and a cathodic circuit trace, 24, which may be at least temporarily on the surface of the circuit substrate. An anodic blind via, 26, is formed which is in electrical contact with the conductive foil forming the anode interior to the demarcation relative to the capacitive couple. The anodic blind via allows a conductor therein to form an electrical contact between the anode and an anode circuit trace, 28. An anodic through via, 30, passing through the entire substrate, is in electrical contact with the anode interior to the demarcation relative to the capacitive couple and is then in electrical contact with at least one anodic trace, 32, on a surface of the circuit substrate. It would be apparent that additional laminations may occur such that the traces described are ultimately interior to a layered circuit board.

Another embodiment will be described with reference to FIGS. 7-11. In the Figs., the substrate, 10, foil, 12, and dielectric, 13, are as described above. An isolation dam, 40, is formed on the surface of the dielectric. In one embodiment, the interior area of the dam is the shape and size of the intended cathode and the isolation dam circumvents the cathode. The isolation dam prior to formation of a cathode is illustrated in top schematic view in FIG. 7 and cross-sectional schematic view in FIG. 8 taken along line 8-8 of FIG. 7. A solid electrolyte and optional but preferred carbon and conductive layers are formed within the area of the isolation dam to form the cathode of a capacitor. The resulting capacitor is illustrated in top schematic view in FIG. 9 and in schematic cross-sectional view in FIG. 10 taken along line 10-10 of FIG. 9. The isolation dam, 40, forms a pool within which the cathode, 42, is coated. After formation of the cathode, an optional but preferred metal layer, 44, is formed and the capacitors are singulated. In one embodiment, the substrate is diced along a line, 46, to isolate one or more discrete capacitor(s) on a substrate. Alternatively, the line, 46, represents a demarcation line wherein the conductive foil is interrupted between capacitors to electrically isolate discrete capacitors on a common substrate or to form discrete capacitors with a common anode. As mentioned previously, the demarcation can represent a narrow band which is sufficiently wide for electrical isolation, or a portion, up to the entire foil not otherwise functioning as the anode of a capacitor, can be removed.

Figure 11:
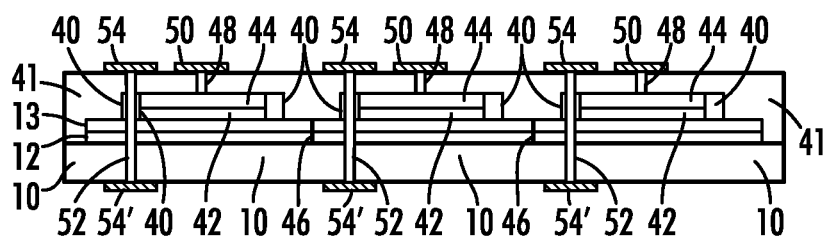
FIG. 11 is a cross-sectional side view of an embodiment of the present invention.

A particularly preferred embodiment is illustrated schematically after further processing in FIG. 11. Shown therein is additional circuit board material, 41, laminated over the capacitor. As would be apparent, electrical connectivity must be made between the capacitor and traces for the function of the capacitor to be realized in an electrical circuit. Illustrated in FIG. 11 are blind vias, 48, primarily for the cathodic couple, wherein the cathode is in electrical contact with a cathode trace, 50. Through vias, 52, are preferably formed through the isolation dam, 40, such that the isolation dam forms a sleeve with the through via therein. A conductor dispensed in the through via forms an electrical connection between the conductive foil, which functions as the anode, and an anode trace, 54, on at least one side of the laminated device. It would be apparent from the figure that a blind via through the isolation dam could also be utilized, wherein the blind via does not pass entirely through the structure but only through to the extent necessary to be in electrical contact with the conductive foil anode.

Figure 12:
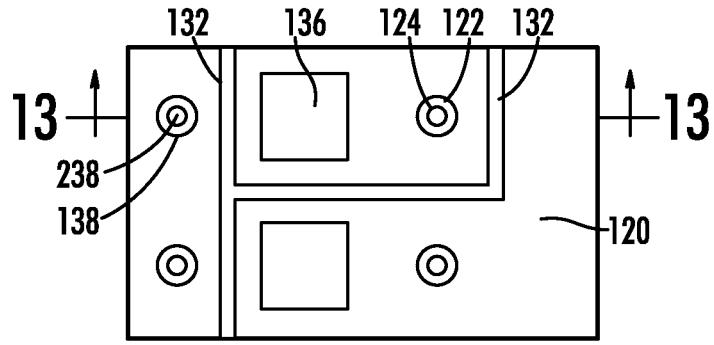
FIG. 12 is a schematic top view of an embodiment of the present invention.
Figure 13:
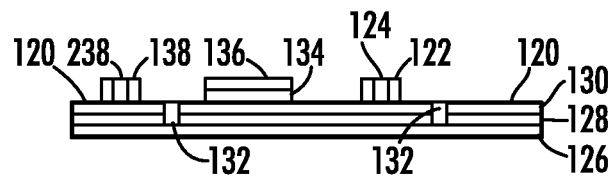
FIG. 13 is a cross-sectional side view taken along line 13-13 of FIG. 12.

An embodiment of the present invention is illustrated in schematic top view in FIG. 12 and schematic cross-sectional view in FIG. 13 taken along line 13-13 of FIG. 12. In FIGS. 12 and 13, a substrate, 126, has a foil laminated thereon. The foil comprises a first conductive layer, 128, such as a metal foil, and dielectric, 130. A cathode comprising a solid electrolyte, 134, and a second conductive layer, 136, is formed on the dielectric, such that the cathode and foil form a capacitive couple with the dielectric therebetween. The capacitive couple is isolated electrically by demarcations, 132. An isolation dam, 122, provides a via location for connection to the anode which is isolated from the remaining foil by the demarcation. A second isolation dam, 138, is provided wherein a through hole, 238, is ultimately formed for additional functionality.

Figure 14:
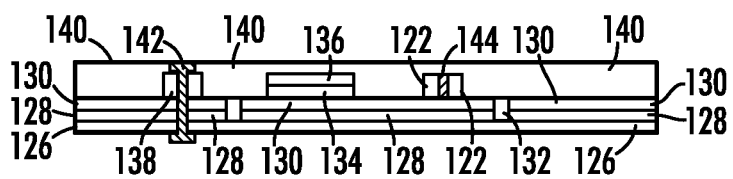
FIG. 14 is a cross-sectional side view of an embodiment of the present invention.

An additional embodiment of the present invention is illustrated in schematic cross-sectional side view in FIG. 14. In FIG. 14, the substrate, 126, first conductive layer, 128, dielectric, 130, demarcation, 132, solid electrolyte layer, 134, isolation dam, 122, and second isolation dam, 138, are as described with reference to FIGS. 12 and 13. In FIG. 14, additional lamination, 140, has been added to encase the capacitor elements, thereby forming a laminated substrate with embedded capacitance. An anodic via, 144, illustrated as a blind via, is in the first isolation dam, 122. A second via, 142, illustrated as a through via, is formed in the second isolation dam, 138. The second via can be utilized to form electrical connectivity with the foil which may, or may not, be utilized in the capacitance functionality of the substrate.

Figure 15:
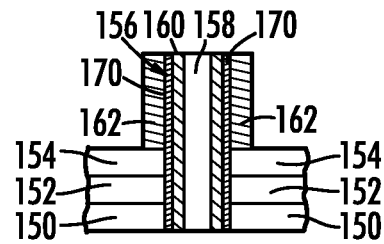
FIG. 15 is a cross-sectional side view of an embodiment of the present invention.

Yet another embodiment is illustrated in cross-sectional side view in FIG. 15. In FIG. 15, a substrate, 150, has a metal foil, 152 and 154, coated thereon, wherein the metal foil has a conductive metal, 152, and a dielectric, 154. An isolation dam, 156, is applied on the dielectric. A via, 156, preferably a through via, is formed through the isolation dam, 162, wherein the via is larger than ultimately desired. The via is preferably coated with a dielectric, 170. The via is then redrilled and filled with a conductive material, 160, The via is reformed with a smaller size than the previous via thereby forming a second via. The result is a via, 158, with a collar therein. The material can be a conductive material, such as copper, thereby forming a through via with a conductive sleeve therein. Alternatively, the material, 160, can be an insulator material thereby forming an insulative collar.

A particular feature of the present invention is the ability to form a capacitor with thin layers which would otherwise be difficult to manufacture. Capacitive elements with a thickness of less than 250 μm as measured from the cathode face to the opposing anode face can easily be formed with the present invention. The ability to manufacture a capacitor with thin active layers increases the capacitive volume which is an ongoing desire in capacitor manufacture. The present invention allows for the manufacture of a capacitor, being the anode, dielectric and cathode, of about 10 μm to about 250 μm thick. More preferably, the present invention allows for the manufacture of capacitors which are less than 100 μm and more preferably less than 50 μm.

The printed circuit layers may be formed of commonly used printed circuit board materials such as FR-4, but the present invention is compatible with most available multilayer printed circuit materials.

In one embodiment, each subsequent layer is slightly smaller than the previous layer such that the surface projection of each layer leaves a frame from the previous layer in a "wedding cake" arrangement. This is preferred for manufacturing simplicity since it would be extremely difficult to coat a subsequent layer with the exact area of the underlying area without some material dripping down the edge of the stacked layers. Obviously, it is desirable to have as much surface area of capacitance as possible without sacrificing losses due to a subsequent layer not being isolated to the surface.

The substrate is not particularly limited for demonstrating the invention. Particularly suitable substrates include copper, copper-coated circuit substrates such as FR-4, polyimide, phenolic, BT, and various Rogers high performance materials such as TMM, etc. Glass reinforced polymer is a particularly preferred substrate.

The terms anode and cathode as used herein refer to the two conductive layers separated by a dielectric thereby forming a capacitive couple. For the purposes of the present invention the anode refers to the metal foil and the cathode refers to the conductive layer formed on the dielectric of the anode foil. By convention the anode is the positive terminal and the cathode is the negative terminal yet this could be reversed if contained within the lowered stress limit, without detriment and without departing from the meets and bounds of the instant invention.

The isolation dam is a non-conductive material capable of being applied to a surface and forming a raised barrier thereon. The material is preferably applied as a thixotropic material. Particularly preferred isolation dam materials include polyimides, silicones, and epoxies.

In the present invention, through vias and through holes are defined as vias which go through all layers in place at the time of via formation. A blind via is a via which goes through less than all of the layers in place at the time of via formation.

Dice cutting, as used herein, refers to a cutting operation which separates discrete capacitors from the carrier or from each other and may be a complete severing or only be partially through the device. Exemplary methods include routing, saw dicing, blade dicing, water jet cutting, laser cutting, chemical etching, selective heating, laser ablation and the like.

The foil is laminated to the substrate preferably using an adhesive. Particular preferred adhesives include polyimides, epoxies, and acrylates.

The invention has been described with particular reference to the preferred embodiments without limit thereto. One of skill in the art would realize additional embodiments which are not specifically recited but within the scope of the claims appended hereto.

The invention claimed is:

1. A layered substrate comprising:
   a first substrate;
   a valve metal conductive foil laminated to said first substrate wherein said valve metal conductive foil comprises a valve metal oxide dielectric thereon;
   a cathode on said dielectric;
   a second substrate forming a layered structure with said valve metal conductive foil and said cathode between said first substrate and said second substrate;
   a first trace on at least one of said first substrate and said second substrate;
   a first via forming an electrical connection between said cathode and said first trace;
   a second trace on at least one of said first substrate and said second substrate; and a second via forming an electrical connection between said valve metal conductive foil and said second trace.

2. The layered substrate of claim 1 further comprising an isolation dam between said first substrate and said second substrate.

3. The layered substrate of claim 2 wherein a via or plated through hole passes through said isolation dam.

4. The layered substrate of claim 2 wherein said isolation dam circumvents said cathode.

5. The layered substrate of claim 1 wherein said cathode comprises a solid electrolyte layer.

6. The layered structure of claim 5 wherein said solid electrolyte layer comprises at least one conductor selected from the group consisting of conductive polymeric materials and manganese dioxide.

7. The layered structure of claim 6 wherein said conductive polymeric material comprises at least one material selected from the group consisting of polypyrrole, polyaniline, and polythiophene.

8. The layered structure of claim 1 wherein said valve metal conductive foil comprises one material selected from aluminum, tantalum, niobium, titanium and NbO.

9. The layered structure of claim 8 wherein said valve metal conductive foil comprises aluminum.

10. The layered structure of claim 8 wherein said dielectric comprises at least dielectric oxide selected from aluminum, tantalum, titanium and niobium.

11. The layered structure of claim 1 wherein said substrate comprises a glass-reinforced polymer.

12. A layered substrate comprising:
an embedded capacitor comprising:
a first substrate wherein said first substrate comprises a material selected from the group consisting of copper, copper coated circuit substrate, polyimide, phenolic and glass reinforced polymer;
a valve metal conductive foil laminated to said first substrate wherein said valve metal conductive foil comprises a valve metal oxide dielectric thereon;
a cathode on said dielectric;
a second substrate forming a layered structure with said valve metal conductive foil and said cathode between said first substrate and said second substrate and wherein said second substrate comprises a material selected from the group consisting of copper, copper coated circuit substrate, polyimide, phenolic and glass reinforced polymer;
a first trace on at least one of said first substrate and said second substrate;
a first via forming an electrical connection between said cathode and said first trace;
a second trace on at least one of said first substrate and said second substrate; and
a second via forming an electrical connection between said valve metal conductive foil and said second trace.

* * * * *